United States Patent
Park et al.

(10) Patent No.: US 8,853,010 B2
(45) Date of Patent: Oct. 7, 2014

(54) SEMICONDUCTOR DEVICE AND METHOD OF FABRICATING THE SAME

(75) Inventors: Heung-Kyu Park, Gyeongbuk (KR); Woo-Bin Song, Hwaseong-si (KR); Nam-Kyu Kim, Yongin-si (KR); Su-Jin Jung, Suwon-si (KR); Byeong-Chan Lee, Yongin-si (KR); Young-Pil Kim, Hwaseong-si (KR); Sun-Ghil Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 382 days.

(21) Appl. No.: 13/368,584

(22) Filed: Feb. 8, 2012

(65) Prior Publication Data
US 2013/0005096 A1    Jan. 3, 2013

(30) Foreign Application Priority Data
Jul. 1, 2011    (KR) .......... 10-2011-0065545

(51) Int. Cl.
| H01L 21/00 | (2006.01) |
| H01L 21/84 | (2006.01) |
| H01L 21/336 | (2006.01) |
| H01L 21/337 | (2006.01) |
| H01L 21/338 | (2006.01) |
| H01L 21/339 | (2006.01) |
| H01L 29/165 | (2006.01) |
| H01L 29/78 | (2006.01) |
| H01L 29/66 | (2006.01) |
| H01L 21/8238 | (2006.01) |

(52) U.S. Cl.
CPC ...... *H01L 21/823807* (2013.01); *H01L 29/165* (2013.01); *H01L 29/78* (2013.01); *H01L 29/66651* (2013.01); *H01L 29/66621* (2013.01); *H01L 29/7848* (2013.01); *H01L 21/823814* (2013.01); *H01L 29/66545* (2013.01)
USPC ........... 438/147; 438/163; 438/174; 438/194; 438/291; 438/300; 257/E21.411; 257/E21.415; 257/E21.43; 257/E21.431; 257/E21.434

(58) Field of Classification Search
None
See application file for complete search history.

(56) References Cited

U.S. PATENT DOCUMENTS

| 6,566,734 | B2 | 5/2003 | Sugihara et al. | |
| 7,138,320 | B2 * | 11/2006 | van Bentum et al. | 438/300 |
| 2005/0093072 | A1 * | 5/2005 | Bonges et al. | 257/360 |
| 2005/0280102 | A1 | 12/2005 | Oh et al. | |
| 2009/0020820 | A1 * | 1/2009 | Baik et al. | 257/369 |
| 2009/0291540 | A1 * | 11/2009 | Zhang et al. | 438/229 |
| 2011/0248353 | A1 * | 10/2011 | Bhattacharyya et al. | 257/369 |
| 2012/0329228 | A1 * | 12/2012 | Yin et al. | 438/285 |

* cited by examiner

*Primary Examiner* — Mohsen Ahmadi
(74) *Attorney, Agent, or Firm* — Onello & Mello, LLP

(57) ABSTRACT

A semiconductor device comprises a substrate and first and second stress-generating epitaxial regions on the substrate and spaced apart from each other. A channel region is on the substrate and positioned between the first and second stress-generating epitaxial regions. A gate electrode is on the channel region. The channel region is an epitaxial layer, and the first and second stress-generating epitaxial regions impart a stress on the channel region.

21 Claims, 12 Drawing Sheets

SEMICONDUCTOR DEVICE AND METHOD OF FABRICATING THE SAME

This application claims priority from Korean Patent Application No. 10-2011-0065545 filed on Jul. 1, 2011, in the Korean Intellectual Property Office, the disclosure of which is incorporated herein by reference in its entirety.

BACKGROUND

1. Field

Embodiments of the present inventive concepts relate to semiconductor devices and methods of fabricating the same.

2. Description of the Related Art

In the manufacture of highly integrated semiconductor devices, methods of increasing the mobility of carriers within channel regions are under active research in an effort to enhance device performance. In one approach, it has been determined that enhanced carrier mobility is achievable by applying a tensile or compressive stress to a channel region by forming a stress layer in a semiconductor device.

Specifically, electron mobility can be enhanced in an n-channel metal oxide semiconductor (NMOS) region in which major carriers are electrons by forming a tensile stress layer. Also, hole mobility can be enhanced in a p-channel metal oxide semiconductor (PMOS) region in which major carriers are holes by forming a compressive stress layer. To further enhance the effect of applied stress, each of a source region and a drain region may be formed as a tensile stress layer or a compressive stress layer by, for example, a selective epitaxial growth (SEG) process.

In the source and drain regions formed by the SEG process, non-uniform crystal growth can lead to defects such as a stacking fault defects. Such defects can negatively affect the reliability of the resulting semiconductor device.

SUMMARY

Aspects of the present inventive concepts provide semiconductor devices with enhanced performance.

Aspects of the present inventive concepts also provide methods of fabricating a semiconductor devices with enhanced performance.

In one aspect, a semiconductor device comprises: a substrate; first and second stress-generating epitaxial regions on the substrate and spaced apart from each other; a channel region on the substrate and positioned between the first and second stress-generating epitaxial regions, the channel region being an epitaxial layer, the first and second stress-generating epitaxial regions imparting a stress on the channel region; and a gate electrode on the channel region.

In some embodiments, the channel region is grown using the underlying substrate as a seed layer.

In some embodiments, the channel region is grown further using the first and second stress-generating epitaxial regions as a seed layer.

In some embodiments, the channel region is grown under stress of the first and second stress-generating epitaxial regions In some embodiments, the first and second stress-generating epitaxial regions impart a compressive stress on the channel region.

In some embodiments, the first and second stress-generating epitaxial regions comprise SiGe.

In some embodiments, the first and second stress-generating epitaxial regions comprise source and drain regions and wherein the semiconductor device comprises a PMOS transistor.

In some embodiments, the compressive stress imparted on the channel region increases a mobility of hole carriers in the channel region.

In some embodiments, the first and second stress-generating epitaxial regions impart a tensile stress on the channel region.

In some embodiments, the first and second stress-generating epitaxial regions comprise SiC.

In some embodiments, the first and second stress-generating epitaxial regions comprise source and drain regions and wherein the semiconductor device comprises an NMOS transistor.

In some embodiments, the tensile stress imparted on the channel region increases a mobility of electron carriers in the channel region.

In some embodiments, the semiconductor device further comprises a gate insulating layer between the gate electrode and the channel region.

In some embodiments, the gate insulating layer comprises a high-k material.

In some embodiments, the gate insulating layer further extends along sidewalls of the gate electrode.

In some embodiments, the gate electrode comprises a metal material.

In some embodiments, the metal material comprises at least one selected from the group consisting of: Al, TiN, TaN, Ti In some embodiments, the channel region has a lower boundary that lies below lower boundaries of the first and second stress-generating epitaxial regions, relative to an upper surface of the substrate.

In some embodiments, the channel region is positioned in a recess in the substrate so that a lower boundary of the channel region lies below lower boundaries of the first and second stress-generating epitaxial regions.

In some embodiments, the channel region has an upper surface that is higher than upper surfaces of the first and second stress-generating epitaxial regions.

In some embodiments, the substrate extends in a horizontal direction and wherein the first and second stress-generating epitaxial regions are spaced apart from each other in the horizontal direction.

In another aspect, a semiconductor device comprises: a substrate; first and second stress-generating epitaxial regions on the substrate and spaced apart from each other; a channel region on the substrate and positioned between the first and second stress-generating epitaxial regions, the channel region being an epitaxial layer grown under stress of the first and second stress-generating epitaxial regions; and a gate electrode on the channel region.

In some embodiments, the first and second stress-generating epitaxial regions impart a stress on the channel region.

In some embodiments, the channel region is grown using the underlying substrate as a seed layer.

In some embodiments, the channel region is grown further using the first and second stress-generating epitaxial regions as a seed layer.

In some embodiments, the first and second stress-generating epitaxial regions impart a compressive stress on the channel region.

In some embodiments, the first and second stress-generating epitaxial regions comprise SiGe.

In some embodiments, the first and second stress-generating epitaxial regions comprise source and drain regions and wherein the semiconductor device comprises a PMOS transistor.

In some embodiments, the compressive stress imparted on the channel region increases a mobility of hole carriers in the channel region.

In some embodiments, the first and second stress-generating epitaxial regions impart a tensile stress on the channel region.

In some embodiments, the first and second stress-generating epitaxial regions comprise SiC.

In some embodiments, the first and second stress-generating epitaxial regions comprise source and drain regions and wherein the semiconductor device comprises an NMOS transistor.

In some embodiments, the tensile stress imparted on the channel region increases a mobility of electron carriers in the channel region.

In some embodiments, the semiconductor device further comprises a gate insulating layer between the gate electrode and the channel region.

In some embodiments, the gate insulating layer comprises a high-k material.

In some embodiments, the gate insulating layer further extends along sidewalls of the gate electrode.

In some embodiments, the gate electrode comprises a metal material.

In some embodiments, the metal material comprises at least one selected from the group consisting of: Al, TiN, TaN, Ti In some embodiments, the channel region has a lower boundary that lies below lower boundaries of the first and second stress-generating epitaxial regions, relative to an upper surface of the substrate.

In some embodiments, the channel region is positioned in a recess in the substrate so that a lower boundary of the channel region lies below lower boundaries of the first and second stress-generating epitaxial regions.

In some embodiments, the channel region has an upper surface that is higher than upper surfaces of the first and second stress-generating epitaxial regions.

In some embodiments, the substrate extends in a horizontal direction and wherein the first and second stress-generating epitaxial regions are spaced apart from each other in the horizontal direction.

In another aspect, a semiconductor device comprises: a substrate; a source region and a drain region on the substrate and spaced apart from each other, the source region and the drain region comprising at least one of SiGe and SiC; a channel region on the substrate between the source region and the drain region, the channel region being an epitaxial layer; and a gate electrode on the channel region.

In some embodiments, the source region and the drain region impart a compressive stress on the channel region.

In some embodiments, the compressive stress imparted on the channel region increases a mobility of hole carriers in the channel region.

In some embodiments, the source region and the drain region impart a tensile stress on the channel region.

In some embodiments, the tensile stress imparted on the channel region increases a mobility of electron carriers in the channel region.

In some embodiments, the channel region is grown under stress of source and drain regions.

In some embodiments, the source region and the drain region comprise an epitaxial layer.

In some embodiments, the source region and the drain region are doped with n-type impurities.

In some embodiments, the source region and the drain region are doped with p-type impurities.

In another aspect, a semiconductor device comprises: a substrate including first and second regions; first and second compressive-stress-generating epitaxial regions on the substrate and spaced apart from each other in the first region of the substrate; first and second tensile-stress-generating epitaxial regions on the substrate and spaced apart from each other in the second region of the substrate; a first channel region on the substrate and positioned between the first and second compressive-stress-generating epitaxial regions, the first channel region being an epitaxial layer, the first and second compressive-stress-generating epitaxial regions imparting a compressive stress on the first channel region; a second channel region on the substrate and positioned between the first and second tensile-stress-generating epitaxial regions, the second channel region being an epitaxial layer, the first and second tensile-stress-generating epitaxial regions imparting a tensile stress on the second channel region; and a first gate electrode on the first channel region, and a second gate electrode on the second channel region.

In some embodiments, the first and second compressive-stress generating epitaxial regions, the first channel region and the first gate electrode comprise a PMOS transistor, and wherein the first and second tensile-stress generating epitaxial regions, the second channel region and the second gate electrode comprise an NMOS transistor.

In some embodiments, the first and second compressive-stress-generating epitaxial regions are doped with p-type impurities and wherein the first and second tensile-stress-generating epitaxial regions are doped with n-type impurities.

In some embodiments, the semiconductor device further comprises an isolation region in the substrate between the first and second regions.

In some embodiments, the semiconductor device further comprises an insulating layer at sidewalls of the first and second gate electrodes and on the first and second compressive-stress-generating epitaxial regions in the first region and on the first and second tensile-stress-generating epitaxial regions in the second region.

In some embodiments, the semiconductor device further comprises an insulative spacer at sidewalls of the first and second electrodes.

In some embodiments, the semiconductor device further comprises a gate insulating layer between the first and second gate electrodes and the respective first and second channel regions.

In some embodiments, the gate insulating layer further extends along sidewalls of the first and second gate electrodes.

In some embodiments, the first and second compressive-stress-generating epitaxial regions comprise SiGe.

In some embodiments, the first and second tensile-stress-generating epitaxial regions comprise SiC.

In some embodiments, the compressive stress imparted on the first channel region increases a mobility of hole carriers in the first channel region.

In some embodiments, the tensile stress imparted on the second channel region increases a mobility of electron carriers in the second channel region.

In another aspect, a method of forming a semiconductor device comprises: epitaxially forming first and second stress-generating regions on a substrate and spaced apart from each other; epitaxially forming a channel region between the first and second stress-generating regions; and providing an electrode on the channel region.

In some embodiments, epitaxially forming the first and second stress-generating regions comprises epitaxially forming using the underlying substrate as a seed layer.

In some embodiments, epitaxially forming the channel region comprises epitaxially forming using the first and second stress-generating regions as a seed layer.

In some embodiments, epitaxially forming the channel region comprises epitaxially forming the channel region under stress of the first and second stress-generating regions.

In some embodiments, the first and second stress-generating regions impart a compressive stress on the channel region.

In some embodiments, the first and second stress-generating regions comprise SiGe.

In some embodiments, the first and second stress-generating regions comprise source and drain regions and wherein the semiconductor device comprises a PMOS transistor.

In some embodiments, the compressive stress imparted on the channel region increases a mobility of hole carriers in the channel region.

In some embodiments, the first and second stress-generating regions impart a tensile stress on the channel region.

In some embodiments, the first and second stress-generating regions comprise SiC.

In some embodiments, the first and second stress-generating regions comprise source and drain regions and wherein the semiconductor device comprises an NMOS transistor.

In some embodiments, the tensile stress imparted on the channel region increases a mobility of electron carriers in the channel region.

In some embodiments, the method further comprises forming a gate insulating layer on the channel region prior to providing the electrode.

In some embodiments, the gate insulating layer comprises a high-k material.

In some embodiments, forming the gate comprises forming the gate electrode using a metal material.

In some embodiments, the metal material comprises one selected from the group consisting of: Al, TiN, TaN, Ti.

In some embodiments, the method further comprises: prior to the epitaxially forming the channel region, forming a recess in the substrate between the first and second stress-generating regions; and epitaxially forming the channel region in the recess.

In some embodiments, epitaxially forming the channel region provides a channel region that has an upper surface that is higher than upper surfaces of the first and second stress-generating regions.

In some embodiments, the substrate extends in a horizontal direction and wherein the first and second stress-generating regions are spaced apart from each other in the horizontal direction.

In another aspect, a method of forming a semiconductor device comprises: providing a substrate including first and second regions; providing first and second compressive-stress-generating epitaxial regions on the substrate and spaced apart from each other in the first region of the substrate; providing first and second tensile-stress-generating epitaxial regions on the substrate and spaced apart from each other in the second region of the substrate; epitaxially forming a first channel region between the first and second compressive-stress-generating epitaxial regions, the first and second compressive-stress-generating epitaxial regions imparting a compressive stress on the first channel region; epitaxially forming a second channel region between the first and second tensile-stress-generating epitaxial regions, the first and second tensile-stress-generating epitaxial regions imparting a tensile stress on the second channel region; and providing a first gate electrode on the first channel region and a second gate electrode on the second channel region.

In some embodiments, providing first and second compressive-stress-generating epitaxial regions in the first region of the substrate comprises: epitaxially growing an SiGe layer in the first region of the substrate.

In some embodiments, providing first and second tensile-stress-generating epitaxial regions in the second region of the substrate comprises: epitaxially growing an SiC layer in the second region of the substrate.

In some embodiments, providing the first and second gate electrodes further comprises: providing first and second gate electrode dummy patterns on the SiGe layer in the first region and on the SiC layer in the second region, respectively; providing an interlayer insulator layer on the first and second gate electrode dummy patterns; planarizing the interlayer insulator layer to expose upper portions of the first and second gate electrode dummy patterns; removing the gate electrode dummy patterns; removing portions of the SiGe layer and SiC layer exposed by the removal of the dummy patterns using the interlayer insulator layer as a mask to expose the underlying substrate; epitaxially forming the first and second channel regions on the exposed substrate; providing a gate insulating layer on the first and second channel regions; forming a gate electrode layer on the gate insulating layer and on the interlayer insulator layer in the first and second regions; and planarizing the gate electrode layer to expose the interlayer insulator layer, thereby providing the first gate electrode on the first channel region and the second gate electrode on the second channel region.

In some embodiments, the method further comprises providing insulative spacers at sidewalls of the first and second gate electrode dummy patterns before providing the interlayer insulator layer.

In another aspect, a method of forming a semiconductor device comprises: epitaxially growing an SiGe layer in a first region of a substrate; epitaxially growing an SiC layer in a second region of the substrate; providing first and second gate electrode dummy patterns on the SiGe layer in the first region and on the SiC layer in the second region, respectively; providing an interlayer insulator layer on the first and second gate electrode dummy patterns; planarizing the interlayer insulator layer to expose upper portions of the first and second gate electrode dummy patterns; removing the gate electrode dummy patterns; removing portions of the SiGe layer and SiC layer exposed by the removal of the dummy patterns using the interlayer insulator layer as a mask to expose the underlying substrate to form spaced-apart source and drain regions of the SiGe layer in the first region of the substrate and to form spaced-apart source and drain regions of the SiC layer in the second region of the substrate; epitaxially forming a first channel region on the exposed substrate between the source and drain regions in the first region of the substrate and epitaxially forming a second channel region on the exposed substrate between the source and drain regions in the second region of the substrate; providing a gate insulating layer on the first and second channel regions; forming a first gate electrode layer and a second gate electrode layer on the gate insulating layer and on the interlayer insulator layer in the first and second regions respectively; and planarizing the first and second gate electrode layers to expose the interlayer insulator layer, thereby providing the first gate electrode on the first channel region and the second gate electrode on the second channel region.

In some embodiments: the spaced-apart source and drain regions of the SiGe layer impart a compressive stress on the first channel region; and the spaced-apart source and drain regions of the SiC layer impart a tensile stress on the second channel region.

In some embodiments, the method further comprises providing insulative spacers at sidewalls of the first and second gate electrode dummy patterns before providing the interlayer insulator layer.

In another aspect, a memory system comprises: a memory controller that generates command and address signals; and a memory module comprising a plurality of memory devices, the memory module receiving the command and address signals and in response storing and retrieving data to and from at least one of the memory devices, wherein each memory device comprises: a substrate; first and second stress-generating epitaxial regions on the substrate and spaced apart from each other; a channel region on the substrate and positioned between the first and second stress-generating epitaxial regions, the channel region being an epitaxial layer, the first and second stress-generating epitaxial regions imparting a stress on the channel region; and a gate electrode on the channel region.

BRIEF DESCRIPTION OF THE DRAWINGS

The accompanying drawings are included to provide a further understanding of the inventive concept, and are incorporated in, and constitute a part of, this specification. The drawings illustrate exemplary embodiments of the inventive concept and, together with the description, serve to explain principles of the inventive concept. In the drawings.

DETAILED DESCRIPTION

Figure 1:
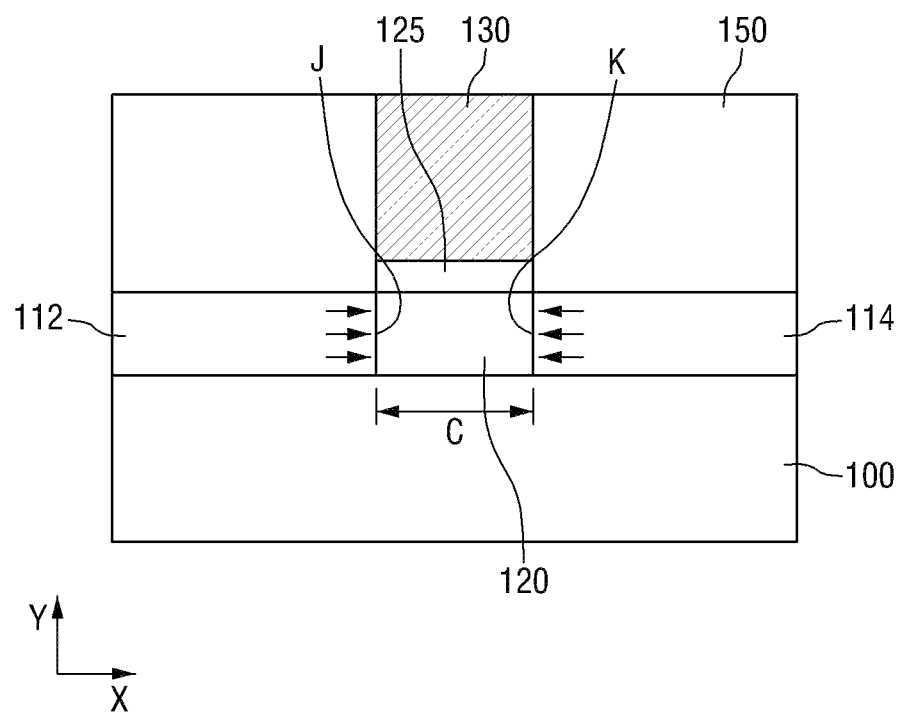
FIG. 1 is a cross-sectional view of a semiconductor device according to an exemplary embodiment of the present inventive concepts.

Embodiments of the present inventive concepts will now be described more fully hereinafter with reference to the accompanying drawings, in which embodiments are shown. This invention may, however, be embodied in different forms and should not be construed as limited to the embodiments set forth herein. Like numbers refer to like elements throughout the specification.

It will be understood that, although the terms "first", "second", etc. are used herein to describe various elements, these elements should not be limited by these terms. These terms are used to distinguish one element from another. For example, a "first" element could be termed a "second" element, and, similarly, a "second" element could be termed a "first" element, without departing from the scope of the present inventive concepts. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.). When an element is referred to herein as being "over" another element, it can be over or under the other element, and either directly coupled to the other element, or intervening elements may be present, or the elements may be spaced apart by a void or gap.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

In the specification, it will be understood that when a layer (or film) is referred to as being 'on' another layer or substrate, it can be directly on the other layer or substrate, or intervening layers may also be present. In the drawings, the dimensions of layers and regions are exaggerated for clarity of illustration. Also, though terms like a first, a second, and a third are used to describe various regions and layers in various embodiments of the present invention, the regions and the layers are not limited to these terms. These terms are used only to discriminate one region or layer from another region or layer. Therefore, a layer referred to as a first layer in one embodiment can be referred to as a second layer in another embodiment. An embodiment described and exemplified herein includes a complementary embodiment thereof. As used herein, the term 'and/or' includes any and all combinations of one or more of the associated listed items. Like reference numerals refer to like elements throughout.

In embodiments of the present inventive concepts, the amount of stress applied to the channel region by the source and drain regions is optimized. In some embodiments, the area of the contact surface between each of the source and drain regions and the channel region is maximized. In this manner, the performance of the resulting device is enhanced.

FIG. 1 is a cross-sectional view of a semiconductor device according to an exemplary embodiment of the present inventive concepts.

Referring to FIG. 1, the semiconductor device includes a semiconductor substrate 100, a channel epitaxial layer 120, a source epitaxial layer 112, a drain epitaxial layer 114, a gate electrode 130, a gate insulating layer 125, and an interlayer insulating film 150.

The semiconductor substrate 100 may comprise, for example, a bulk silicon substrate, a silicon on insulator (SOI) substrate, a germanium substrate, a germanium on insulator (GOI) substrate, a silicon-germanium substrate, an epitaxial thin-film substrate formed by selective epitaxial growth (SEG), or other material suitable for forming a semiconductor substrate.

The channel epitaxial layer 120 may be formed on a channel region C of the semiconductor substrate 100. In one embodiment, the channel epitaxial layer 120 may be formed by SEG.

The source epitaxial layer 112 and the drain epitaxial layer 114 may be formed respectively on both sides of the channel epitaxial layer 120. In some embodiments, the source and drain epitaxial layers 112 and 114 may be in surface contact with the channel epitaxial layer 120. Specifically, the source epitaxial layer 112 may be in surface contact with the channel epitaxial layer 120 at a first contact surface J, and the drain epitaxial layer 114 may be in surface contact with the channel epitaxial layer 120 at a second contact surface K. Here, in an embodiment, the source and drain epitaxial layers 112 and 114 may comprise impurity-containing Si epitaxial layers, and the channel epitaxial layer 120 may comprise a Si epitaxial layer. Specifically, for example, the source and drain epitaxial layers 112 and 114 can comprise Si epitaxial layers that contain at least one of Ge and C, and the channel epitaxial layer 120 can comprise a Si epitaxial layer that does not contain impurities. In some embodiments, an upper portion of the channel layer can be doped with impurities in an ion implantation process to form an n-type or p-type channel region. An n-type channel region may be formed by doping the region with a p-type dopant, for example $BF_2+$, using a low ion implantation energy, for example less than about 50, KeV. A p-type channel region may be formed by doping the region with an n-type dopant, for example As+, using a low ion implantation energy, for example less than about 50, KeV.

In an embodiment where the source and drain epitaxial layers 112 and 114 comprise SiGe epitaxial layers, the channel epitaxial layer 120 may receive compressive stress that is imparted on the channel epitaxial layer 120 by the adjacent source and drain epitaxial layers 112, 114. In this case, assuming the major carriers of the channel epitaxial layer 120 to be holes, the mobility of the carriers can be improved by exposure to compressive stress.

In particular, in the current exemplary embodiment, since the source and drain epitaxial layers 112 and 114 are in contact with the entire side surfaces of the channel epitaxial layer 120, compressive stress can be uniformly applied to the entire side surfaces of the channel epitaxial layer 120. Therefore, the mobility of the carriers can be significantly improved in this configuration, as compared with a configuration where the source and drain epitaxial layers 112 and 114 that are in point contact with the channel epitaxial layer 120 or as compared with a configuration where the source and drain epitaxial layers 112 and 114 are in surface contact with only a portion of the side surfaces of the channel epitaxial layer 120. The resulting increased mobility of the carriers greatly enhances the performance of the semiconductor device.

In an embodiment where the source and drain epitaxial layers 112 and 114 comprise SiC epitaxial layers, the channel epitaxial layer 120 may receive tensile stress that is imparted on the channel epitaxial layer 120 by the adjacent source and drain epitaxial layers 112, 114. See, for example, region II of the embodiment depicted in FIG. 10. In this case, assuming the major carriers of the channel epitaxial layer 120 to be electrons, the mobility of the carriers can be improved by exposure to tensile stress. Also, in this configuration, since tensile stress can be uniformly applied to the entire side surfaces of the channel epitaxial layer 120, as in the case of compressive stress shown above, the mobility of the carriers within the channel epitaxial layer 120 can be significantly improved.

Crystals that form the source and drain epitaxial layers 112 and 114 according to the current exemplary embodiment may be grown uniformly in a direction. Specifically, in some embodiments, crystals that form the source and drain epitaxial layers 112 and 114 may grow uniformly in a direction (e.g., a Y direction) that is perpendicular to the horizontal direction of extension of semiconductor substrate 100. This may be because the source and drain epitaxial layers 112 and 114 are epitaxially grown on the semiconductor substrate 100 in, e.g., the Y direction.

In FIG. 1, the source epitaxial layer 112 is formed on a left side of the channel epitaxial layer 120, and the drain epitaxial layer 114 is formed on a right side of the channel epitaxial layer 120. However, the present invention is not limited thereto. In some configurations, the positions of the source epitaxial layer 112 and the drain epitaxial layer 114 can be reversed.

The gate electrode 130 may be formed on the channel epitaxial layer 120. In particular, in the current exemplary embodiment, the gate electrode 130 may comprise, for example, a metal gate electrode. Examples of metal materials that may be used for the gate electrode 130 may include, but are not limited to, at least one of Cu, Al, W, TiN, and alloys thereof. A gate insulating layer 125 may be positioned between the channel epitaxial layer 120 and the gate electrode 130.

The interlayer insulating film 150 may be formed on the source and drain epitaxial layers 112 and 114. The interlayer insulating film 150 may comprise, for example, $SiN_x$ or $SiO_x$, but is not limited thereto, as any suitable insulating layer may be employed.

Hereinafter, an exemplary method of fabricating the semiconductor device shown in FIG. 1 will be described.

FIGS. 2 through 5 are cross-sectional views illustrating intermediate processes in a method of fabricating the semiconductor device shown in FIG. 1.

Figure 2:
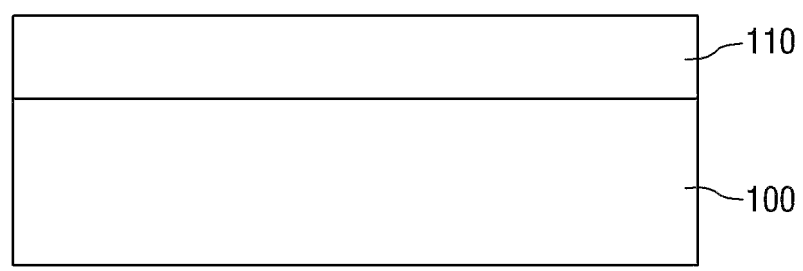
FIGS. 2 through 7 are cross-sectional views illustrating intermediate processes in methods of fabricating the semiconductor device shown in FIG. 1.

Referring to FIG. 2, a pre-epitaxial layer 110 is formed on the semiconductor substrate 100 by epitaxial growth. In an embodiment, the pre-epitaxial layer 110 may comprise a Si epitaxial layer that contains impurities such as Ge or C.

Figure 3:
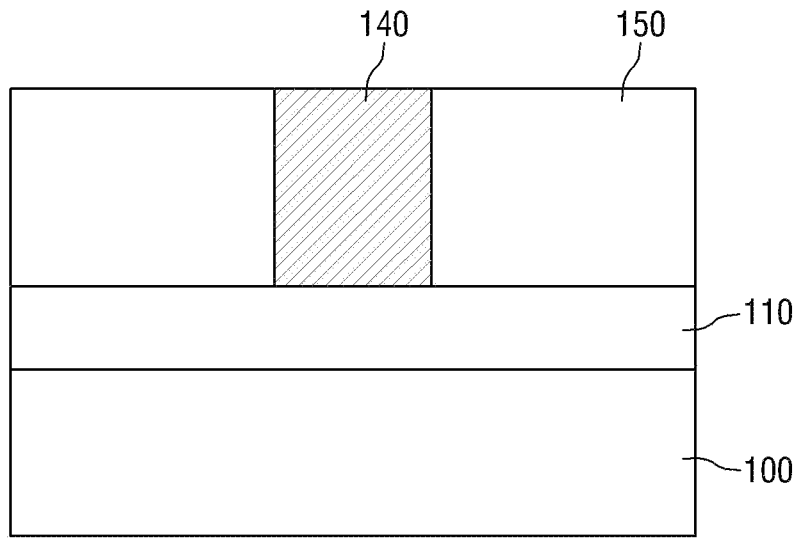

Referring to FIG. 3, a dummy gate 140 and the interlayer insulating film 150 are formed on the pre-epitaxial layer 110. The dummy gate 140 can be formed using a conventional fabrication method. For example, a conductive layer (not shown) comprising, e.g., poly-Si may be disposed on the pre-epitaxial layer 110 and then patterned, thereby forming the dummy gate 140. The dummy gate 140 may comprise a conductive material such as poly-Si. However, embodiments of the present inventive concepts are not limited thereto.

The interlayer insulating film 150 can be formed using a conventional fabrication method. For example, after the dummy gate 140 is formed, an insulating material (not shown) may be formed on the pre-epitaxial layer 110 and the dummy gate 140. Then, the insulating material (not shown) may be planarized until a top surface of the dummy gate 140 is exposed, thereby forming the interlayer insulating film 150.

Figure 4:
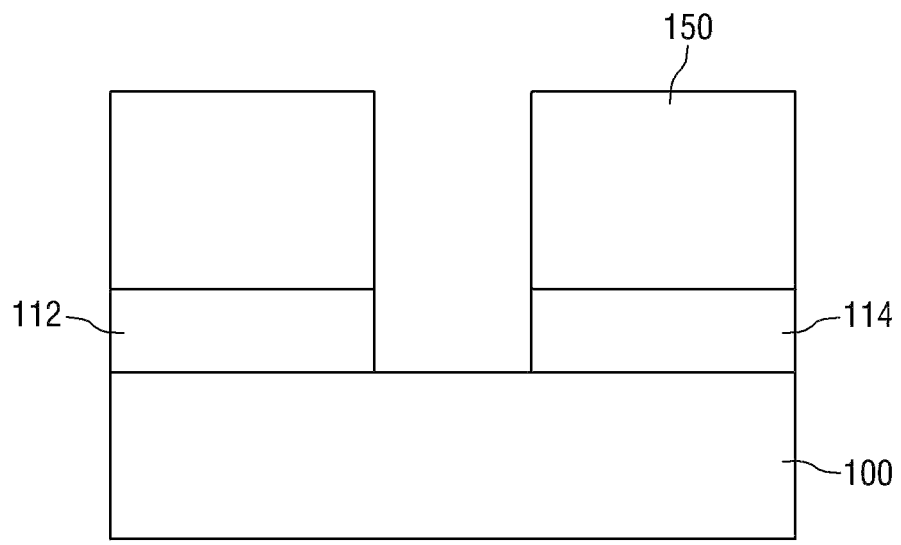

Referring to FIG. 4, the source epitaxial layer 112 and the drain epitaxial layer 114 are formed by removing the dummy gate 140 (see FIG. 3) and the pre-epitaxial layer 110 under the dummy gate 140. The source epitaxial layer 112 and drain epitaxial layer 114 are spaced apart from each other in the horizontal direction. The process of removing of the dummy gate 140 and the pre-epitaxial layer 110 under the dummy gate 140 may include etching the dummy gate 140 and the pre-epitaxial layer 110 under the dummy gate 140 until a top surface of the semiconductor substrate 100 is exposed. In this case, the pre-epitaxial layer 110 under the dummy gate 140 may be etched for a sufficient period of time until the top surface of the semiconductor substrate 100 is exposed.

Figure 5:
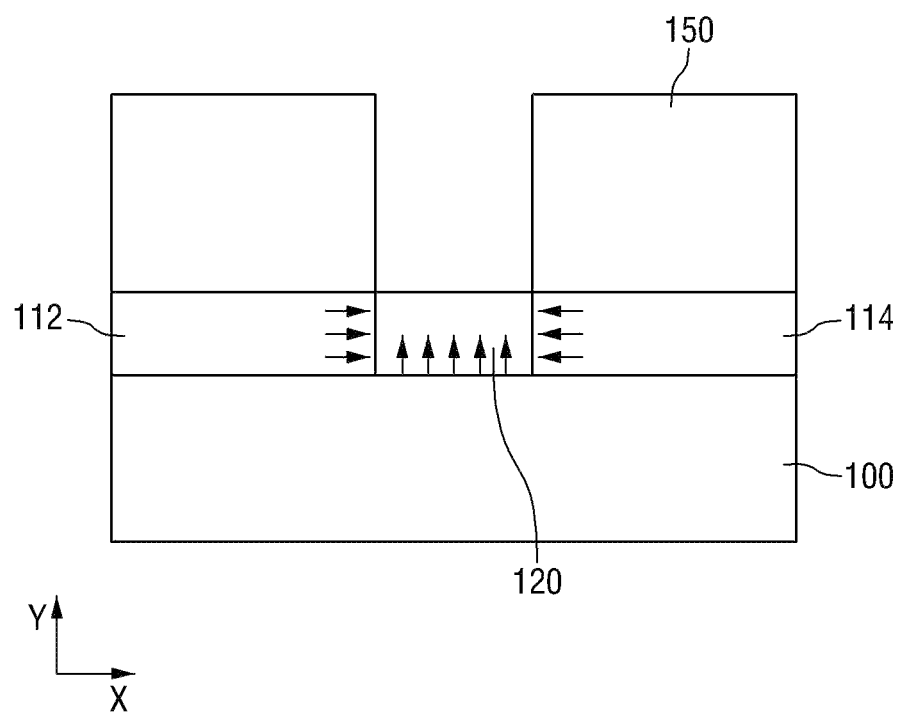

Referring to FIG. 5, the channel epitaxial layer 120 can be formed between the source epitaxial layer 112 and the drain epitaxial layer 114 by selective epitaxial growth (SEG). In one embodiment, the channel epitaxial layer 120 may comprise a Si epitaxial layer formed by SEG. In some embodiments, the channel epitaxial layer 120 is formed on the exposed top surface of the semiconductor substrate 100 but is not formed on the interlayer insulating film 150.

When the source epitaxial layer 112 and the drain epitaxial layer 114 comprise SiGe epitaxial layers, the channel epitaxial layer 120 may grow epitaxially in the Y direction under conditions of compressive stress that is applied to both side surfaces thereof. Although not shown in the drawing, when the source epitaxial layer 112 and the drain epitaxial layer 114 are SiC epitaxial layers, the channel epitaxial layer 120 may grow epitaxially in, e.g., the Y direction under conditions of tensile stress applied to both side surfaces thereof.

In the current exemplary embodiment, as described above, the channel epitaxial layer 120 grows under compressive stress or tensile stress applied to both entire side surfaces thereof. Thus, stress is imparted on the channel epitaxial layer 120 uniformly over the widest possible contact surfaces.

In addition, in the current exemplary embodiment, the pre-epitaxial layer 110 is formed on the semiconductor substrate 100 by epitaxial growth in a direction (e.g., the Y direction) and then patterned to form the source epitaxial layer 112 and the drain epitaxial layer 114. Therefore, crystals that form the source epitaxial layer 112 and the drain epitaxial layer 114 grow uniformly in a direction (e.g., the Y direction).

If a trench (not shown) is formed in the semiconductor 100 and if the source epitaxial layer 112 and the drain epitaxial layer 114 are formed in the trench, crystals may grow in various directions along the shape of the trench (not shown), thereby forming the source epitaxial layer 112 and the drain epitaxial layer 114. In this case, crystals that have grown in each direction may intersect each other in a certain region, and the difference between lattice structures of the crystals that intersect each other may cause a stacking fault.

In the current exemplary embodiment, however, since crystals that form the source epitaxial layer 112 and the drain epitaxial layer 114 grow uniformly in the same direction (e.g., the Y direction), stacking faults can be mitigated or prevented in advance. As a result, reliability of the semiconductor device can be improved, and, by extension, performance of the semiconductor device can be enhanced.

Referring back to FIG. 1, a gate insulating layer 125 is formed on the channel epitaxial layer 120, and the gate electrode 130 is formed on the gate insulating layer 125. The gate electrode 130 may be formed by filling a hole in the interlayer insulating film 150 and on the channel epitaxial layer 120 with metal, or other electrode material, and then planarizing the metal, a process that will be described in further detail below.

The semiconductor device according to the exemplary embodiment illustrated in FIG. 1 can also be fabricated using methods that are different from the above fabrication method. Hereinafter, another exemplary method of fabricating the semiconductor device shown in FIG. 1 will be described.

Figure 6:
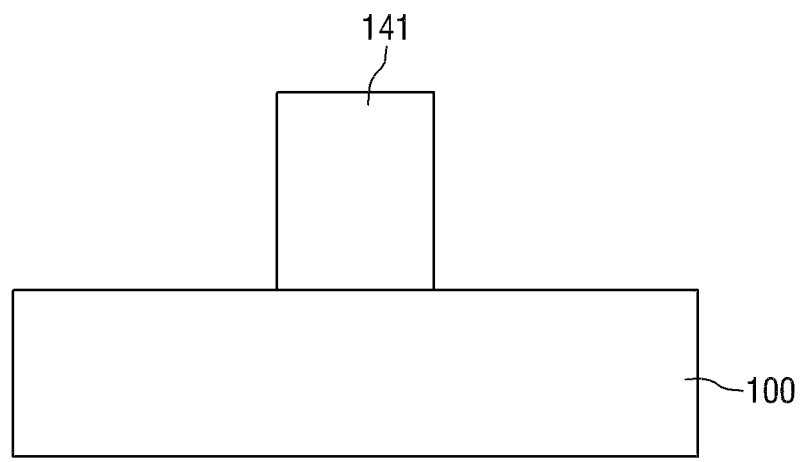
Figure 7:
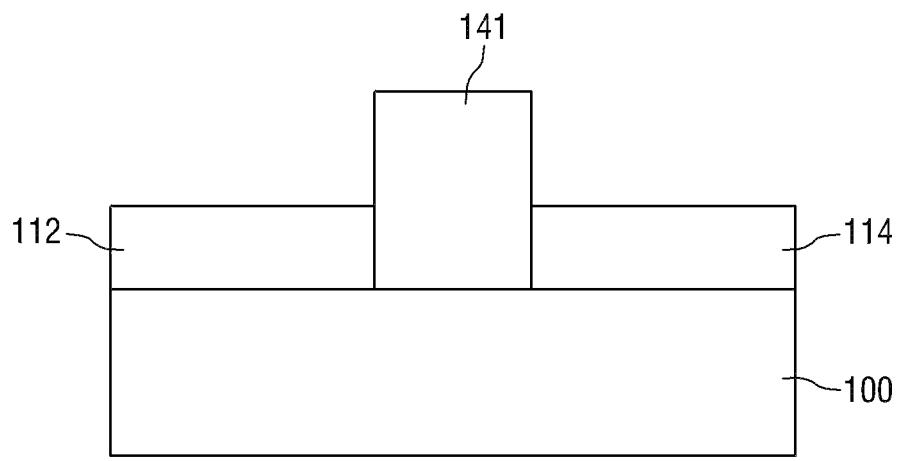

FIGS. 6 and 7 are cross-sectional views illustrating intermediate processes in another method of fabricating the semiconductor device shown in FIG. 1.

Referring to FIG. 6, a dummy gate 141 is formed on the semiconductor substrate 100 prior to formation of an epitaxial layer. The dummy gate 141 may be formed by forming an insulating layer (not shown) on the semiconductor substrate 100 and patterning the insulating layer.

Referring to FIG. 7, the source epitaxial layer 112 and the drain epitaxial layer 114 are formed on the semiconductor substrate 100 by epitaxial growth. Here, the source epitaxial layer 112 and the drain epitaxial layer 114 may be formed on both sides of the dummy gate 141 by, in particular, SEG.

For example, if an SEG process is performed on structure of FIG. 6 including the dummy gate 141, and assuming the dummy gate 141 comprises an insulating material such as SiNx or SiOx, no epitaxial layer is formed on the dummy gate 141, and epitaxial growth occurs only on exposed portions of the semiconductor substrate 100. In this manner, the source epitaxial layer 112 and the drain epitaxial layer 114 can be selectively formed on both sides of the dummy gate 141 as shown in the drawing.

In FIG. 7, the source epitaxial layer 112 and the drain epitaxial layer 114 are selectively formed on both sides of the dummy gate 141 by the SEG process. However, embodiments of the present invention are not limited thereto. As will be described later, since the dummy gate 141 is removed following formation of the source epitaxial layer 112 and the drain epitaxial layer 114, whether an epitaxial layer is formed on the dummy gate 141 is irrelevant.

The interlayer insulating film 150 is formed on the source epitaxial layer 112 and the drain epitaxial layer 114, and at least a portion (e.g., the channel region C) of the top surface of the semiconductor substrate 100 is exposed as shown in FIG. 4 by removing the dummy gate 141 (see FIG. 7). Then, as shown in FIG. 5, the channel epitaxial layer 120 is formed on the exposed top surface of the semiconductor substrate 100 by SEG, and the gate insulating layer 125 and gate electrode 130 (see FIG. 1) are formed on the channel epitaxial layer 120. The resulting semiconductor device is shown in FIG. 1.

Hereinafter, a semiconductor device and a method of fabricating the same according to another exemplary embodiment will be described with reference to FIGS. 8 and 9. For the sake of simplicity, a description of elements substantially identical to those of the previous embodiments will be omitted, and differences between the current and previous embodiments will primarily be described.

Figure 8:
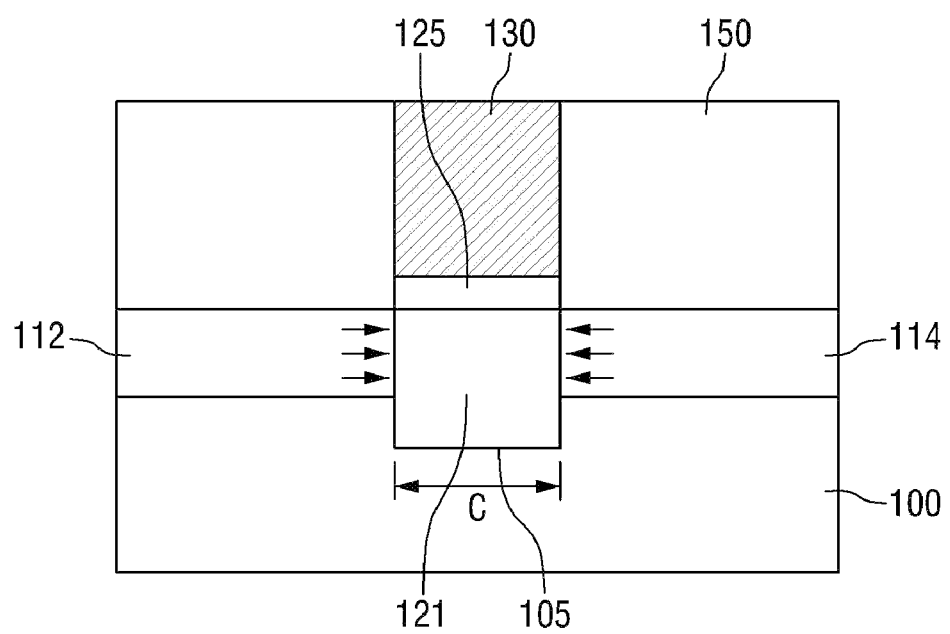
FIG. 8 is a cross-sectional view of a semiconductor device according to another exemplary embodiment of the present inventive concepts.
Figure 9:
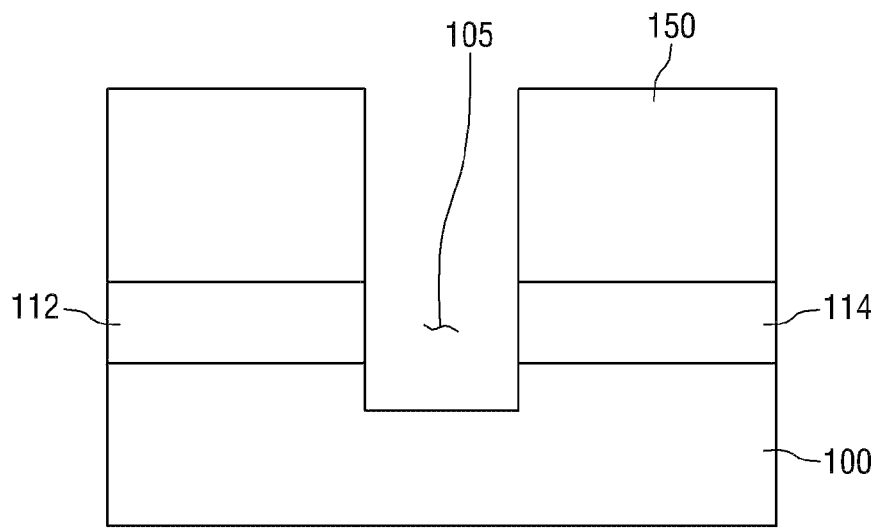
FIG. 9 is a cross-sectional view illustrating intermediate processes in a method of fabricating the semiconductor device shown in FIG. 8.

FIG. 8 is a cross-sectional view of a semiconductor device according to another exemplary embodiment of the present invention. FIG. 9 is a cross-sectional view illustrating intermediate processes in a method of fabricating the semiconductor device shown in FIG. 8.

Referring to FIG. 8, a channel epitaxial layer 121 of the semiconductor device is formed on a channel region C of a semiconductor substrate 100. Here, the channel epitaxial layer 121 may be formed within a channel trench 105 or recess formed in the semiconductor substrate 100. That is, a bottom surface of the channel epitaxial layer 121 may be lower than bottom surfaces of the source epitaxial layer 112 and a drain epitaxial layer 114, relative to an upper surface of the substrate.

In this example embodiment, an upper region of the channel epitaxial layer 121 thus formed is subject to compressive stress (or tensile stress) on the entire side surfaces thereof imparted from the source epitaxial layer 112 and the drain epitaxial layer 114. Therefore, the mobility of carriers within the channel epitaxial layer 121 can be effectively improved.

The semiconductor device according to the current exemplary embodiment can be formed using various conventional fabrication methods. For example, the channel trench 105 may be formed in the semiconductor substrate 100 as shown in FIG. 9 by over-etching a pre-epitaxial layer 110 (see FIG. 3) under the dummy gate 140 (see FIG. 3) or the dummy gate 141 (see FIG. 7). Then, the channel epitaxial layer 121 (see FIG. 8) may be epitaxially grown in the resulting channel trench 105, thereby forming the semiconductor device according to the current exemplary embodiment.

Hereinafter, a semiconductor device according to another exemplary embodiment will be described with reference to FIG. 10. The following description will also focus primarily on differences between the current and previous embodiments.

Figure 10:
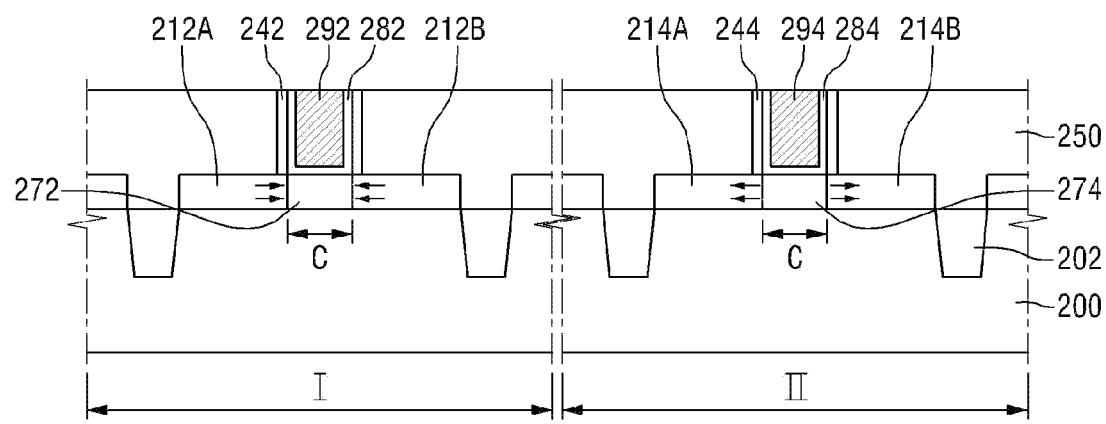
FIG. 10 is a cross-sectional view of a semiconductor device according to another exemplary embodiment of the present inventive concepts.

FIG. 10 is a cross-sectional view of a semiconductor device according to another exemplary embodiment.

Referring to FIG. 10, the semiconductor device includes a semiconductor substrate 200, first and second channel epitaxial layers 272 and 274, first and second source epitaxial layers 212A and 214A, first and second drain epitaxial layers 212B and 214B, first and second gate electrodes 292 and 294, and an interlayer insulating film 250.

The semiconductor substrate 200 may include a first region I and a second region II. In the current exemplary embodiment, the first region I may be a region on which a p-channel metal oxide semiconductor (PMOS) element is formed, and the second region II may be a region on which an n-channel metal oxide semiconductor (NMOS) element is formed. However, embodiments of the present inventive concepts are not limited thereto, and elements formed on the first region I and the second region II can be interchanged as desired. That is, although not shown in the drawing, an NMOS element can be formed on the first region I, and a PMOS element can be formed on the second region II. Alternatively, NMOS elements or PMOS elements can be formed on both the first and second regions I and II.

An element isolation film 202 may be formed in the semiconductor substrate 200. The element isolation film 202 may be, but is not limited to, a shallow trench isolation (STI) film which fills each trench formed in the semiconductor substrate 200 to provide for element isolation.

In FIG. 10, a top surface of the element isolation film 202 is at the same height as a top surface of the semiconductor substrate 200. However, embodiments of the present inventive concepts are not limited thereto. When necessary, the top surface of the element isolation film 202 may be higher or lower than the top surface of the semiconductor substrate 200.

The first and second channel epitaxial layers 272 and 274 may be formed on channel regions C of the semiconductor substrate 200. Specifically, the first channel epitaxial layer 272 may be formed on the channel region C of the first region I of the semiconductor substrate 200, and the second channel epitaxial layer 274 may be formed on the channel region C of the second region II of the semiconductor substrate 200.

The first source epitaxial layer 212A and the first drain epitaxial layer 212B may be formed on both sides of the first channel epitaxial layer 272, and the second source epitaxial layer 214A and the second drain epitaxial layer 214B may be fanned on both sides of the second channel epitaxial layer 274.

The first and second source epitaxial layers 212A and 214A and the first and second drain epitaxial layers 212B and 214B may be formed on the semiconductor substrate 200 on both sides of the first and second channel epitaxial layers 272 and 274, respectively. Specifically, the first and second source epitaxial layers 212A and 214A and the first and second drain epitaxial layers 212B and 214B may be formed on the semiconductor substrate 200 but are not formed on the element isolation film 202.

First and second gate insulating films 282 and 284 may be formed on the first and second channel epitaxial layers 272 and 274, respectively. The first and second gate insulating films 282 and 284 may optionally extend fully or partially along sidewalls of first and second gate spacers 242 and 244, respectively.

Although not shown in detail, the first and second gate insulating films 282 and 284 according to the current exemplary embodiment may have a double-layer structure composed of an interfacial oxide layer (not shown) and a high-k layer (not shown). The interfacial oxide layer may comprise, e.g., $SiO_2$, and the high-k layer may comprise, e.g., $HfO_2$, $Al_2O_3$, $ZrO_2$, or $TaO_2$. However, embodiments of the present inventive concepts are not limited thereto.

The first and second gate electrodes 292 and 294 may be formed on the first and second gate insulating films 282 and 284, respectively. In the current exemplary embodiment, the first and second gate electrodes 292 and 294 may comprise metal gate electrodes.

The first and second gate spacers 242 and 244 may be formed on both sides of the first and second gate electrodes 292 and 294 (or on both sides of the first and second gate insulating films 282 and 284). The first and second gate spacers 242 and 244 may comprise an insulating material such as $SiN_x$ or $SiO_x$. However, embodiments of the present inventive concepts are not limited thereto.

The interlayer insulating film 250 may be formed on the semiconductor substrate 200 and the element isolation film 202. The interlayer insulating film 250 may comprise an insulating material such as $SiN_x$. However, embodiments of the present inventive concepts are not limited thereto.

In the semiconductor device according to the current exemplary embodiment, compressive stress is uniformly applied to both entire side surfaces of the first channel epitaxial layer 272 of the first region I on which a PMOS element (e.g., a PMOS transistor) is formed. Therefore, the mobility of holes which are major carriers of the first channel epitaxial layer 272 can be improved. In addition, tensile stress is uniformly applied to both entire side surfaces of the second channel epitaxial layer 274 of the second region II on which an NMOS element (e.g., an NMOS transistor) is formed. Therefore, the mobility of electrons which are major carriers of the second channel epitaxial layer 274 can be improved.

Hereinafter, an exemplary method of fabricating the semiconductor device shown in FIG. 10 will be described.

FIGS. 11 through 16 are cross-sectional views illustrating intermediate processes in a method of fabricating the semiconductor device shown in FIG. 10.

Figure 11:
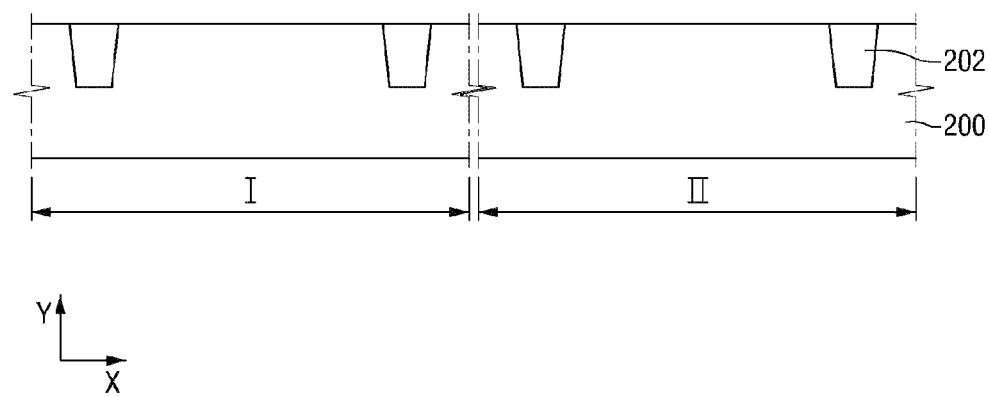
FIGS. 11 through 18 are cross-sectional views illustrating intermediate processes in methods of fabricating the semiconductor device shown in FIG. 10.

Referring to FIG. 11, the element isolation film 202 is formed in the semiconductor substrate 200. Specifically, a trench is foamed in each of the first and second regions I and II of the semiconductor substrate 200 and is filled with an insulating film, thereby forming the element isolation film 202. A top surface of the insulating film which fills the trench may be higher or lower than the top surface of the semiconductor substrate 200.

Figure 12:
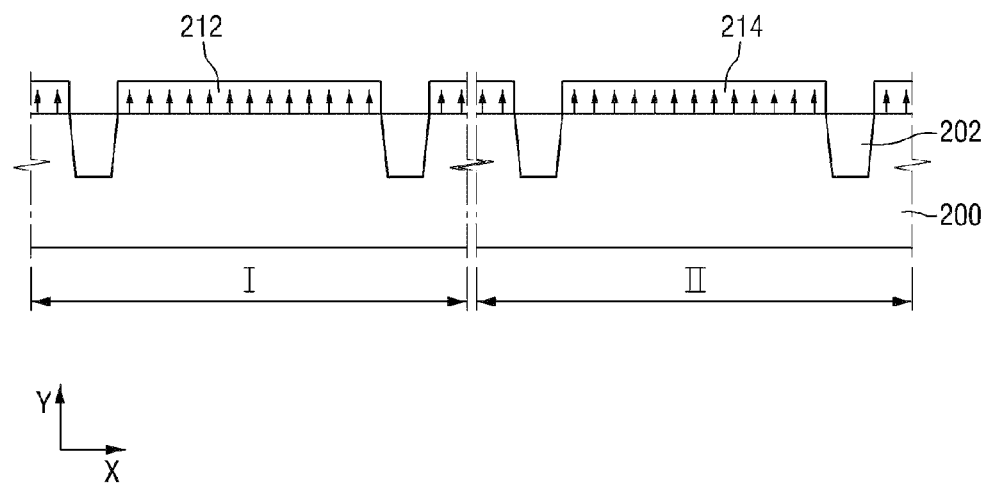

Referring to FIG. 12, first and second pre-epitaxial layers 212 and 214 are formed on the semiconductor substrate 200.

Specifically, the first pre-epitaxial layer 212 is formed on the first region I of the semiconductor substrate 200 by epitaxial growth, while masking the second region II, and the second pre-epitaxial layer 214 is formed on the second region II by epitaxial growth, while masking the first region I.

Here, the first and second pre-epitaxial layers 212 and 214 may be formed by SEG. Specifically, crystals grow on the semiconductor substrate 200 in a direction (e.g., the Y direction) to form the first and second pre-epitaxial layers 212 and 214. In some embodiments, crystal growth occurs on the on the semiconductor substrate 200 using the exposed substrate as a seed layer. However, no crystal growth occurs on the element isolation film 202, since the isolation film does not serve as a seed for crystal growth. Accordingly, the first and second pre-epitaxial layers 212 and 214 are not formed on the element isolation film 202.

The first pre-epitaxial layer 212 may comprise a Si epitaxial layer which contains first impurities, and the second pre-epitaxial layer 214 may comprise a Si epitaxial layer which contains second impurities that are different from the first impurities. Specifically, the first pre-epitaxial layer 212 may comprise, e.g., a SiGe epitaxial layer, and the second pre-epitaxial layer 214 may comprise, e.g., a SiC epitaxial layer. Additional doing can be used to form the pre-epitaxial layer to eventually become source/drain regions. For example, for a PMOS device in the first region I, the source/drain region can be additionally doped with boron. For an NMOS device in the second region II, the source/drain region can be additionally doped with phosphorous.

Figure 13:
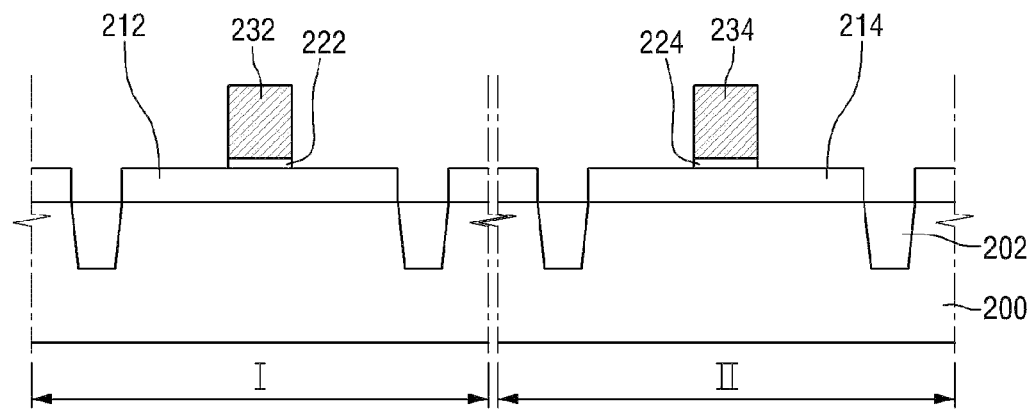

Referring to FIG. 13, first and second buffer oxide film patterns 222 and 224 and first and second dummy gates 232 and 234 are formed on first and second pre-epitaxial layers 212 and 214, respectively. The first and second buffer oxide film patterns 222 and 224 and the first and second dummy gates 232 and 234 can be formed using various conventional fabrication methods. For example, a buffer oxide film (not shown) and a conductive layer (not shown) may be sequentially stacked on the first and second pre-epitaxial layers 212 and 214 and then patterned to form the first and second buffer oxide film patterns 222 and 224 and the first and second dummy gates 232 and 234. Here, the first and second buffer oxide film patterns 222 and 224 and the first and second dummy gates 232 and 234 may be formed on the channel regions C (see FIG. 10) of the semiconductor substrate 200.

Figure 14:
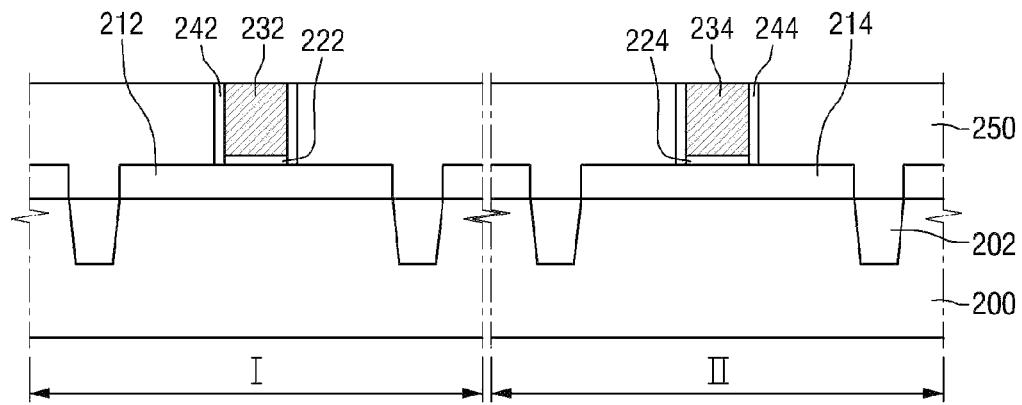

Referring to FIG. 14, the first and second gate spacers 242 and 244 are formed on both sides of the first and second buffer oxide film patterns 222 and 224 and the first and second dummy gates 232 and 234. The first and second gate spacers 242 and 244 may comprise an insulating material such as SiNx or SiOx. However, embodiments of the present inventive concepts are not limited thereto. In the drawing, the first and second gate spacers 242 and 244 are shaped like pillars that extend in a direction perpendicular to the semiconductor substrate 200. However, the shape of the first and second spacers 242 and 244 can be modified as desired, e.g., they can be formed in an 'L' shape, or other shape.

After the formation of the first and second gate spacers 242 and 244, the interlayer insulating film 250 is formed on the semiconductor substrate 200. The interlayer insulating film 250 may be formed by forming an insulating material such as SiNx on the semiconductor substrate 200 and planarizing the insulating material until top surfaces of the first and second dummy gates 232 and 234 are exposed.

Figure 15:
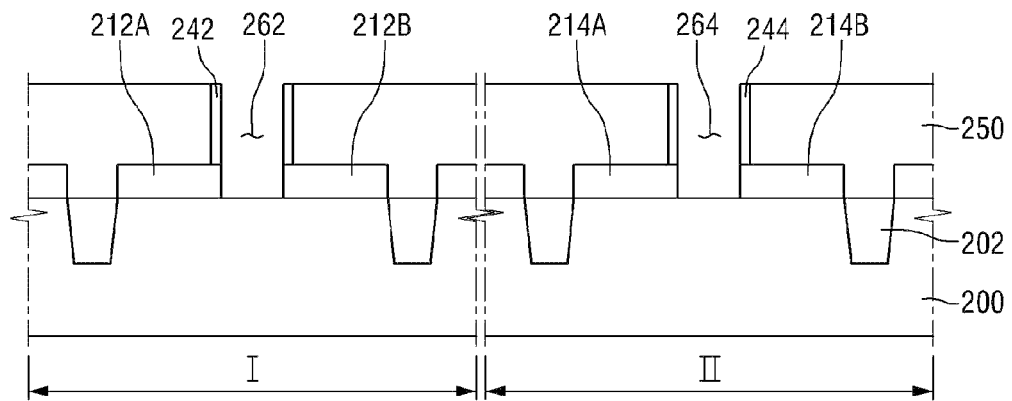
Figure 15:
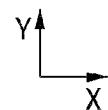

Referring to FIG. 15, first and second trenches 262 and 264 which expose the top surface of the semiconductor substrate 200 are foiled by removing the first and second dummy gates 232 and 234 (see FIG. 14) and the first and second pre-epitaxial layers 212 and 214 (see FIG. 14) under the first and second dummy gates 232 and 234.

Specifically, the first and second dummy gates 232 and 234, the first and second buffer oxide film patterns 222 and 224 and the first and second pre-epitaxial layers 212 and 214 between the first and second gate spacers 242 and 244 are etched for a sufficient period of time to form the first and second trenches 262 and 264 which expose the top surface of the semiconductor substrate 200.

By forming the first and second trenches 262 and 264 as described above, the first source epitaxial layer 212A and the first drain epitaxial layer 212B are formed on both sides of the first trench 262, and the second source epitaxial layer 214A and the second drain epitaxial layer 214B are formed on both sides of the second trench 264.

Figure 16:
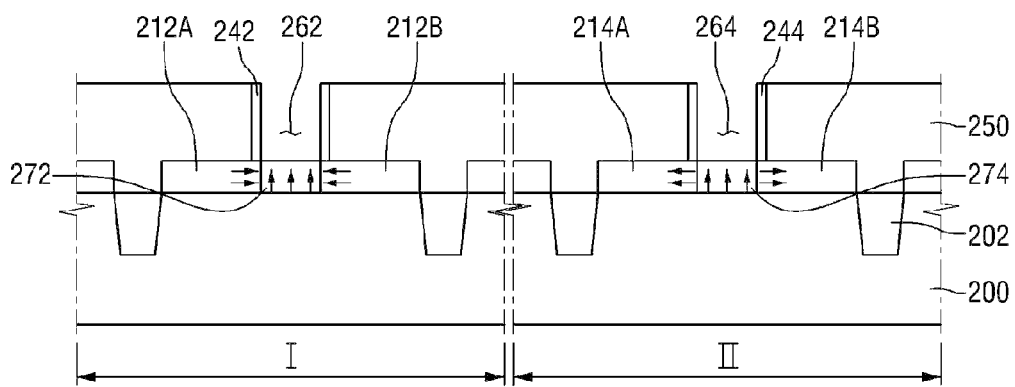
Figure 16:
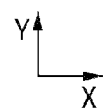

Referring to FIG. 16, the first and second channel epitaxial layers 272 and 274 are formed of Si respectively in the first and second trenches 262 and 264 (see FIG. 15) by SEG. When the first and second channel epitaxial layers 272 and 274 are formed by SEG, crystal growth does not occur on the interlayer insulating film 250 and the first and second gate spacers 242 and 244 but occurs on the exposed semiconductor substrate 200. Therefore, the first channel epitaxial layer 272 may be formed on the semiconductor substrate 200 under conditions of receiving compressive stress imparted from the first source and drain epitaxial layers 212A and 212B, and the second channel epitaxial layer 274 may be formed on the semiconductor substrate 200 under conditions of receiving tensile stress imparted from the second source and drain epitaxial layers 214A and 214B. The compressive or tensile stresses are applied from the source/drain regions, at their boundary regions, to the channel region, as it is being grown. In this manner, the channel region can be considered to be grown under the stress of the neighboring source/drain regions. In general, the stress profile is such that the resulting stress is relatively stronger at the portion of the first and second channel epitaxial layers 272, 274 bordering the neighboring source/drain regions and weakest at the center portions. When voltages are applied to the resulting device, the top portions of the first and second channel epitaxial layers 272, 274, for example those portions nearest the gate electrodes 292, 294, operate as an effective channel regions for the resulting devices.

Referring back to FIG. 10, the first and second gate insulating films 282 and 284 are formed on the first and second channel epitaxial layers 272 and 274 between the first and second gate spacers 242 and 244, respectively. Here, the first and second gate insulating films 282 and 284 may extend along the sidewalls of the first and second gate spacers 242 and 244.

Although not shown in detail, the first and second gate insulating films 282 and 284 according to the current exemplary embodiment may have a double-layer structure composed of an interfacial oxide layer (not shown) and a high-k layer (not shown). The interfacial oxide layer may comprise, e.g., $SiO_2$, and the high-k layer may comprise, e.g., $HfO_2$, $Al_2O_3$, $ZrO_2$, or $TaO_2$. However, embodiments of the present inventive concepts are not limited thereto.

Referring again to FIG. 10, openings on the first and second gate insulating films 282 and 284 are filled with a gate electrode layer, for example metal such as Al, Cu, W, Ti, TaN, or TiN, and then the layer is planarized to form the first and second gate electrodes 292 and 294.

In the current exemplary embodiment, the first and second gate electrodes 292 and 294 comprise metal. However, embodiments of the present inventive concepts are not limited thereto.

In the semiconductor device fabricated using this method, compressive stress is uniformly applied to both entire side surfaces of the first channel epitaxial layer 272, and tensile stress is uniformly applied to both entire side surfaces of the second channel epitaxial layer 274. Therefore, the mobility of holes which are major carriers of the first channel epitaxial layer 272 and the mobility of electrons which are major carriers of the second channel epitaxial layer 274 can be significantly improved.

In the current exemplary embodiment, the first source and drain epitaxial layers 212A and 212B and the second source and drain epitaxial layers 214A and 214B are epitaxially grown directly on the semiconductor substrate 200. Thus, crystals that faun the first source and drain epitaxial layers 212A and 212B and the second source and drain epitaxial layers 214A and 214B grow uniformly in a direction (e.g., the Y direction). Accordingly, the likelihood of a stacking fault occurring in the first source and drain epitaxial layers 212A and 212B and the second source and drain epitaxial layers 214A and 214B is reduced.

In the current exemplary embodiment, a case where a PMOS element and an NMOS element are simultaneously formed on the first and second regions I and II of the semiconductor substrate 200 has been described. However, embodiments of the present inventive concepts are not limited thereto. The order of forming elements can be changed as desired. For example, a PMOS element may be formed on the first region I of the semiconductor substrate 200, and then an NMOS element may be formed on the second region II. Conversely, the NMOS element may be formed on the second region II of the semiconductor substrate 200, and then the PMOS element may be formed on the first region I. In addition, contrary to the current exemplary embodiment, the NMOS element may be formed on the first region I of the semiconductor substrate 200, and the PMOS element may be formed on the second region II.

While the exemplary method of fabricating the semiconductor device shown in FIG. 10 has been described above, it can be modified as desired. Hereinafter, another exemplary method of fabricating the semiconductor device shown in FIG. 10 will be described.

Figure 17:
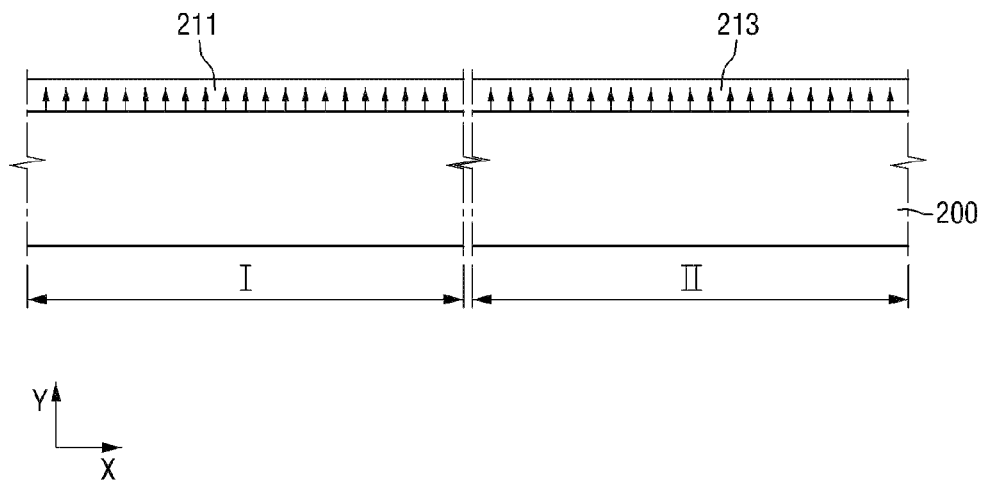
Figure 18:
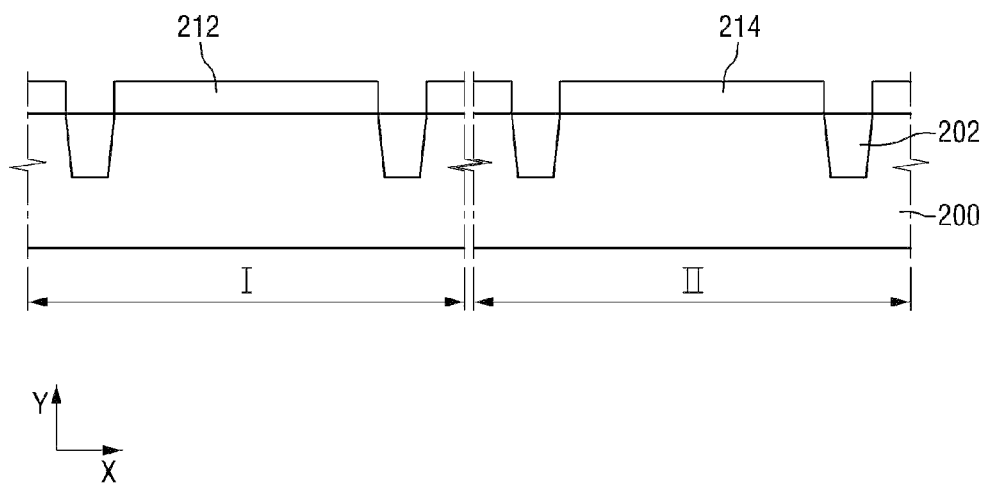

FIGS. 17 and 18 are cross-sectional views illustrating intermediate processes in another method of fabricating the semiconductor device shown in FIG. 10.

Referring to FIG. 17, first and second pre-epitaxial layers 211 and 213 are formed on the semiconductor substrate 200. Specifically, the first pre-epitaxial layer 211 is formed on the entire surface of the first region I of the semiconductor substrate 200 by epitaxial growth, while masking the second region II, and the second pre-epitaxial layer 213 is formed on the entire surface of the second region II of the semiconductor substrate 200 by epitaxial growth, while masking the first region I.

The first pre-epitaxial layer 211 may be a Si epitaxial layer which contains first impurities, and the second pre-epitaxial layer 213 may be a Si epitaxial layer which contains second impurities that are different from the first impurities. Specifically, the first pre-epitaxial layer 211 may comprise, e.g., a SiGe epitaxial layer, and the second pre-epitaxial layer 213 may comprise, e.g., a SiC epitaxial layer.

Referring to FIG. 18, the first and second pre-epitaxial layers 211 and 213 (see FIG. 17) and the semiconductor substrate 200 are patterned to faun element isolation trenches (not shown) in the semiconductor substrate 200. Each of the element isolation trenches (not shown) is filled with an insulating film, thereby forming the element isolation film 202.

Thereafter, processes similar to those of the previous embodiment illustrated in FIG. 16 are performed to fabricate the semiconductor device shown in FIG. 10.

Hereinafter, a semiconductor device and a method of fabricating the same according to another exemplary embodiment will be described with reference to FIGS. 19 and 20. The following description will also focus on differences between the current and previous embodiments.

Figure 19:
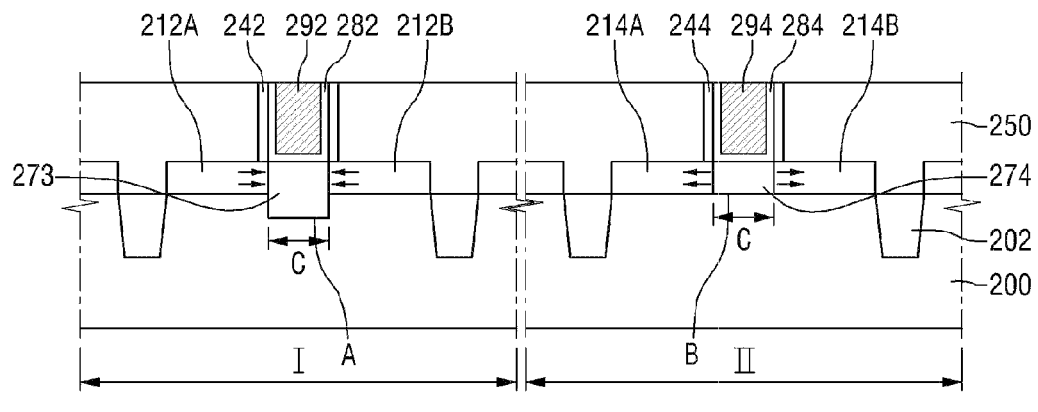
FIG. 19 is a cross-sectional view of a semiconductor device according to another exemplary embodiment of the present inventive concepts.
Figure 19:
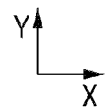
Figure 20:
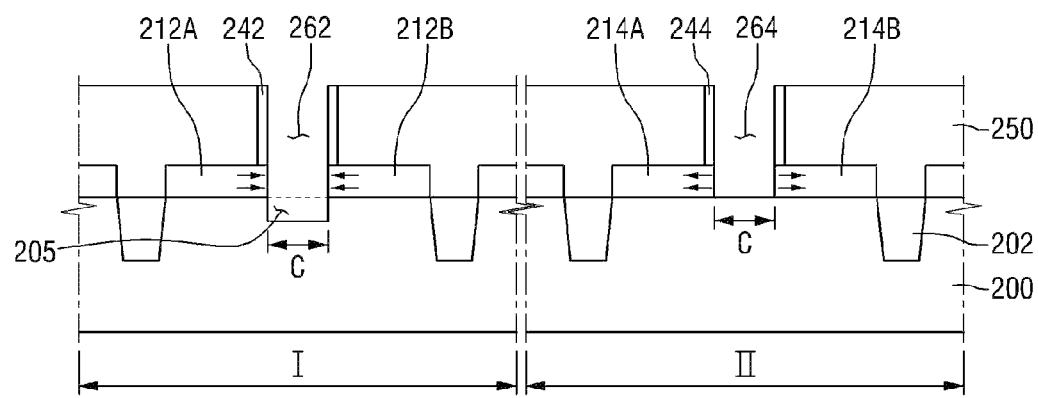
FIG. 20 is a cross-sectional view illustrating intermediate processes in a method of fabricating the semiconductor device shown in FIG. 19.
Figure 20:
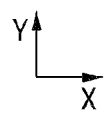

FIG. 19 is a cross-sectional view of a semiconductor device according to another exemplary embodiment of the present invention. FIG. 20 is a cross-sectional view illustrating intermediate processes in a method of fabricating the semiconductor device shown in FIG. 19.

Referring to FIG. 19, a first channel epitaxial layer 273 formed on a first region I of a semiconductor substrate 200 may also be formed in a channel trench 205 (see FIG. 20) formed in the semiconductor substrate 200. Therefore, a bottom surface A of the first channel epitaxial layer 273 formed on the first region I of the semiconductor substrate 200 may be lower than a bottom surface B of a second channel epitaxial layer 274 formed on a second region II of the semiconductor substrate 200.

This semiconductor device can be formed using various conventional fabrication methods. For example, referring to FIG. 20, a first pre-epitaxial layer 212 (see FIG. 14) between first gate spacers 242 formed on the first region I is over-etched to form the channel trench 205 in the semiconductor substrate 200. Then, the first channel epitaxial layer 273 is formed in the channel trench 205 by SEG. As a result, the bottom surface A of the first channel epitaxial layer 273 is lower than the bottom surface B of the second channel epitaxial layer 274.

While, in the present embodiment, the bottom surface A of the first channel epitaxial layer 273 is lower than the bottom surface B of the second channel epitaxial layer 274 in FIG. 19, embodiments of the present inventive concepts are not limited thereto. When necessary, the bottom surface B of the second channel epitaxial layer 274 may be made to be lower than the bottom surface A of the first channel epitaxial layer 273.

Hereinafter, a semiconductor device and a method of fabricating the same according to another exemplary embodiment will be described with reference to FIGS. 21 and 22. The following description will also focus on differences between the current and previous embodiments.

Figure 21:
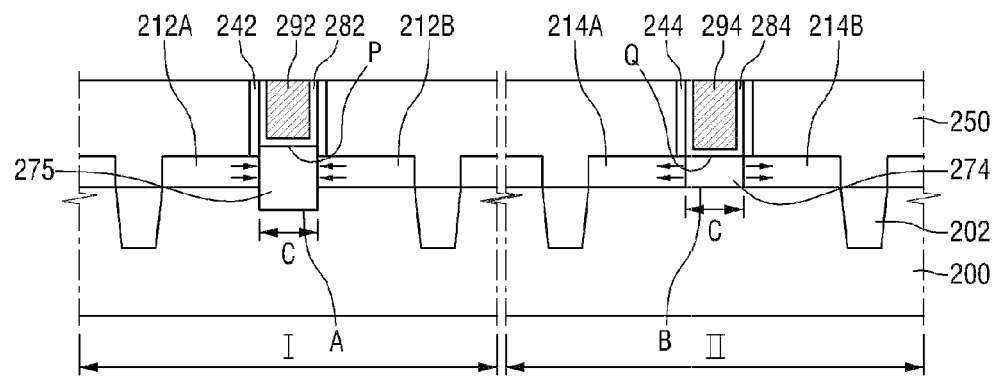
FIG. 21 is a cross-sectional view of a semiconductor device according to another exemplary embodiment of the present inventive concepts.
Figure 22:
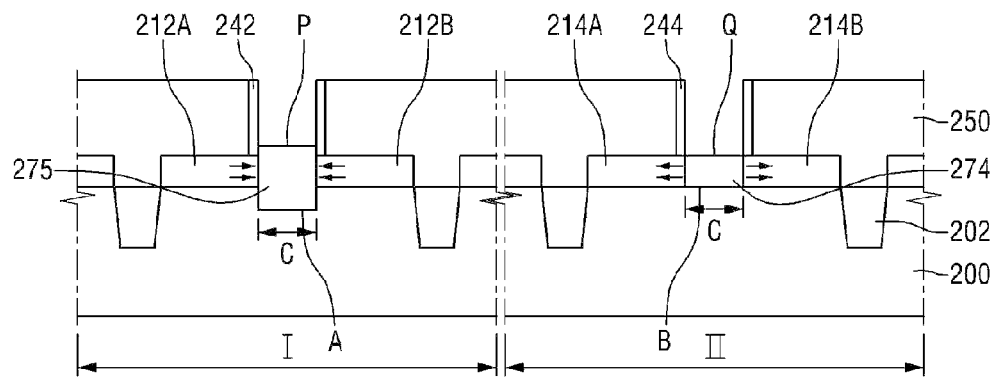
FIG. 22 is a cross-sectional view illustrating intermediate processes in a method of fabricating the semiconductor device shown in FIG. 21.

FIG. 21 is a cross-sectional view of a semiconductor device according to another exemplary embodiment of the present invention. FIG. 22 is a cross-sectional view illustrating intermediate processes in a method of fabricating the semiconductor device shown in FIG. 21.

Referring to FIG. 21, a top surface P of a first channel epitaxial layer 275 formed on a first region I of a semiconductor substrate 200 may be higher than those of adjacent first source and drain epitaxial layers 212A and 212B. In addition, the top surface P of the first channel epitaxial layer 275 formed on the first region I of the semiconductor substrate 200 may be higher than a top surface Q of a second channel epitaxial layer 274 faulted on a second region II of the semiconductor substrate 200.

This semiconductor device can be formed using various conventional fabrication methods. For example, referring to FIG. 22, the first and second channel epitaxial layers 275 and 274 are formed respectively in first and second trenches 262 and 264 (see FIG. 20) by SEG, such that the top surface P of the first channel epitaxial layer 275 is higher than those of the adjacent first source and drain epitaxial layers 212A and 212B or that the top surface Q of the second channel epitaxial layer 274, thereby fabricating the semiconductor device shown in FIG. 21.

While the top surface P of the first channel epitaxial layer 275 is higher than those of the adjacent first source and drain epitaxial layers 212A and 212B in FIG. 21, embodiments of the present inventive concepts are not limited thereto. In other embodiments, the top surface Q of the second channel epitaxial layer 274 may be made to be higher than those of adjacent second source and drain epitaxial layers 214A and 214B. In addition, while the top surface P of the first channel epitaxial layer 275 is higher than the top surface Q of the second channel epitaxial layer 274 in FIG. 21, the top surface Q of the second channel epitaxial layer 274 can also be made to be higher than the top surface P of the first channel epitaxial layer 275. That is, combinations of various un-illustrated embodiments are possible.

Figure 23A:
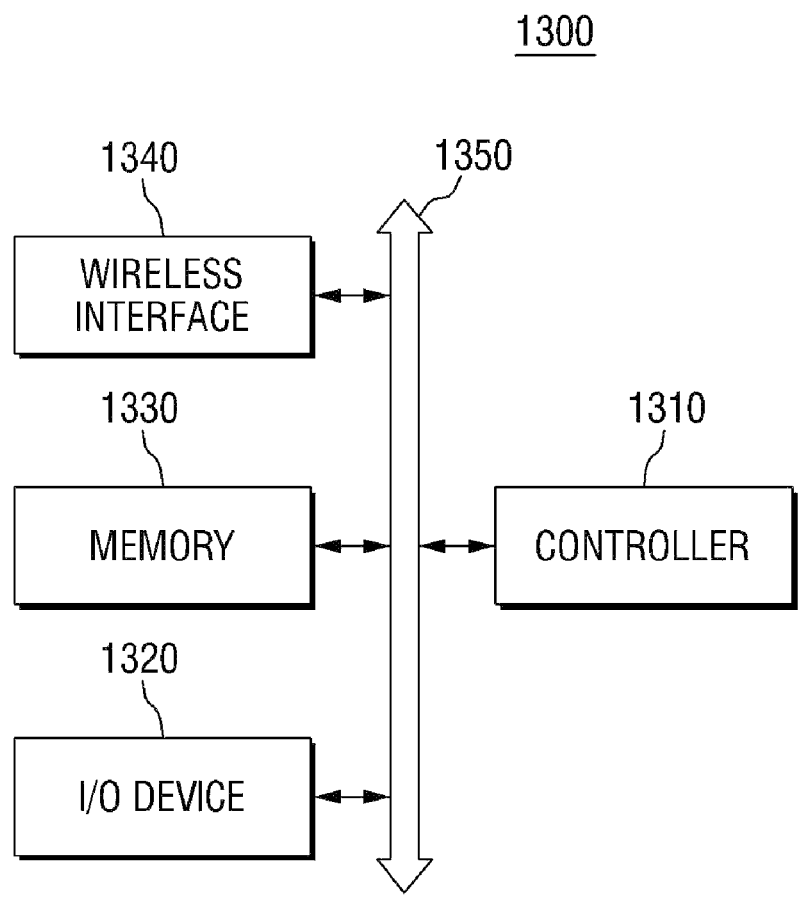
FIGS. 23A and 23B are block diagrams schematically illustrating electronic devices including a semiconductor device according to example embodiments of the inventive concepts.
Figure 23B:
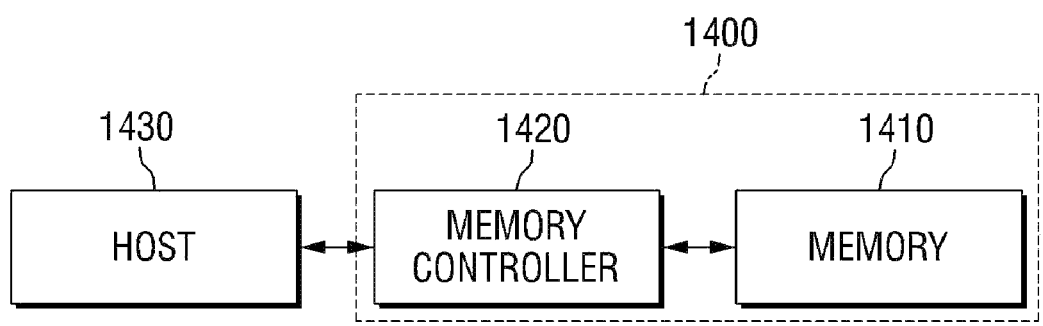

FIGS. 23A and 23B are block diagrams schematically illustrating electronic devices including a semiconductor device according to example embodiments of the inventive concepts.

Referring to FIG. 23A, an electronic device 1300 including a semiconductor device according to example embodiments of the inventive concepts will be described. The electronic device 1300 may be used in one of a personal digital assistant (PDA), a laptop computer, a mobile computer, a web tablet, a wireless phone, a cell phone, a digital music player, a wire or wireless electronic device, or a complex electronic device including at least two ones thereof. The electronic device 1300 may include a controller 1310, an input/output device 1320 such as a keypad, a keyboard, a display, a memory 1330, and a wireless interface 1340 that are combined to each other through a bus 1350. The controller 1310 may include, for example, at least one microprocessor, a digital signal process, a microcontroller or the like. The memory 1330 may be configured to store a command code to be used by the controller 1310 or a user data. The memory 1330 may include a semiconductor device according to example embodiments of the inventive concepts. The electronic device 1300 may use a wireless interface 1340 configured to transmit data to or receive data from a wireless communication network using a RF signal. The wireless interface 1340 may include, for example, an antenna, a wireless transceiver and so on. The electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Referring to FIG. 23B, a memory system including a semiconductor device according to example embodiments of the inventive concepts will be described. The memory system 1400 may include a memory device 1410 for storing huge amounts of data and a memory controller 1420. The memory controller 1420 controls the memory device 1410 so as to read data stored in the memory device 1410 or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may be a semiconductor device according to example embodiments of the inventive concepts.

While embodiments of the inventive concept have been particularly shown and described with references to preferred embodiments thereof, it will be understood by those skilled in the art that various changes in form and details may be made herein without departing from the spirit and scope of the inventive concept as defined by the appended claims.

What is claimed is:

1. A method of forming a semiconductor device comprising:
    epitaxially forming first and second stress-generating regions on a substrate and spaced apart from each other;
    epitaxially forming a channel region between the first and second stress-generating regions; wherein epitaxially forming the channel region provides a channel region that has an upper surface that is higher than upper surfaces of the first and second stress-generating regions; and
    providing an electrode on the channel region; and further comprising:
        prior to the epitaxially forming the channel region, forming a recess in the substrate between the first and second stress-generating regions; and
        epitaxially forming the channel region in the recess, wherein the substrate extends in a horizontal direction and wherein the first and second stress-generating regions are spaced apart from each other in the horizontal direction.

2. The method of claim 1, wherein epitaxially forming the first and second stress-generating regions comprises epitaxially forming using the underlying substrate as a seed layer.

3. The method of claim 2, wherein epitaxially forming the channel region comprises epitaxially forming using the first and second stress-generating regions as a seed layer.

4. The method of claim 1, wherein epitaxially forming the channel region comprises epitaxially forming the channel region under stress of the first and second stress-generating regions.

5. The method of claim 1, wherein the first and second stress-generating regions impart a compressive stress on the channel region.

6. The method of claim 5, wherein the first and second stress-generating regions comprise SiGe.

7. The method of claim 5, wherein the first and second stress-generating regions comprise source and drain regions and wherein the semiconductor device comprises a PMOS transistor.

8. The method of claim 5, wherein the compressive stress imparted on the channel region increases a mobility of hole carriers in the channel region.

9. The method of claim 1, wherein the first and second stress-generating regions impart a tensile stress on the channel region.

10. The method of claim 9, wherein the first and second stress-generating regions comprise SiC.

11. The method of claim 9, wherein the first and second stress-generating regions comprise source and drain regions and wherein the semiconductor device comprises an NMOS transistor.

12. The method of claim 9, wherein the tensile stress imparted on the channel region increases a mobility of electron carriers in the channel region.

13. The method of claim 1 further comprising forming a gate insulating layer on the channel region prior to providing the electrode.

14. The method of claim 13, wherein the gate insulating layer comprises a high-k material.

15. The method of claim 1, wherein forming the gate comprises forming the gate electrode using a metal material.

16. The method of claim 15, wherein the metal material comprises at least one selected from the group consisting of: Al, TiN, TaN, Ti.

17. A method of forming a semiconductor device comprising:
providing a substrate including first and second regions;
providing first and second compressive-stress-generating epitaxial regions on the substrate and spaced apart from each other in the first region of the substrate by epitaxially growing an SiGe layer in the first region of the substrate;
providing first and second tensile-stress-generating epitaxial regions on the substrate and spaced apart from each other in the second region of the substrate by epitaxially growing an SiC layer in the second region of the substrate;
epitaxially forming a first channel region between the first and second compressive-stress-generating epitaxial regions, the first and second compressive-stress-generating epitaxial regions imparting a compressive stress on the first channel region;
epitaxially forming a second channel region between the first and second tensile-stress-generating epitaxial regions, the first and second tensile-stress-generating epitaxial regions imparting a tensile stress on the second channel region; and
providing a first gate electrode on the first channel region and a second gate electrode on the second channel region.

18. The method of claim 17, wherein providing the first and second gate electrodes further comprises:
providing first and second gate electrode dummy patterns on the SiGe layer in the first region and on the SiC layer in the second region, respectively;
providing an interlayer insulator layer on the first and second gate electrode dummy patterns;
planarizing the interlayer insulator layer to expose upper portions of the first and second gate electrode dummy patterns;
removing the gate electrode dummy patterns;
removing portions of the SiGe layer and SiC layer exposed by the removal of the dummy patterns using the interlayer insulator layer as a mask to expose the underlying substrate;
epitaxially forming the first and second channel regions on the exposed substrate;
providing a gate insulating layer on the first and second channel regions;
forming a gate electrode layer on the gate insulating layer and on the interlayer insulator layer in the first and second regions; and
planarizing the gate electrode layer to expose the interlayer insulator layer, thereby providing the first gate electrode on the first channel region and the second gate electrode on the second channel region.

19. The method of claim 18 further comprising providing insulative spacers at sidewalls of the first and second gate electrode dummy patterns before providing the interlayer insulator layer.

20. A method of forming a semiconductor device comprising:
epitaxially growing an SiGe layer in a first region of a substrate;
epitaxially growing an SiC layer in a second region of the substrate;
providing first and second gate electrode dummy patterns on the SiGe layer in the first region and on the SiC layer in the second region, respectively;
providing an interlayer insulator layer on the first and second gate electrode dummy patterns;
planarizing the interlayer insulator layer to expose upper portions of the first and second gate electrode dummy patterns;
removing the gate electrode dummy patterns;
removing portions of the SiGe layer and SiC layer exposed by the removal of the dummy patterns using the interlayer insulator layer as a mask to expose the underlying substrate to form spaced-apart source and drain regions of the SiGe layer in the first region of the substrate and to form spaced-apart source and drain regions of the SiC layer in the second region of the substrate;
epitaxially forming a first channel region on the exposed substrate between the source and drain regions in the first region of the substrate and epitaxially forming a second channel region on the exposed substrate between the source and drain regions in the second region of the substrate;
providing a gate insulating layer on the first and second channel regions;
forming a first gate electrode layer and a second gate electrode layer on the gate insulating layer and on the interlayer insulator layer in the first and second regions respectively; and
planarizing the first and second gate electrode layers to expose the interlayer insulator layer, thereby providing the first gate electrode on the first channel region and the second gate electrode on the second channel region, and, further comprising:
providing insulative spacers at sidewalls of the first and second gate electrode dummy patterns before providing the interlayer insulator layer.

21. The method of claim 20 wherein:
the spaced-apart source and drain regions of the SiGe layer impart a compressive stress on the first channel region; and
the spaced-apart source and drain regions of the SiC layer impart a tensile stress on the second channel region.

* * * * *